US009246507B2

(12) United States Patent
Terazawa

(10) Patent No.: US 9,246,507 B2
(45) Date of Patent: Jan. 26, 2016

(54) ANALOGUE TO DIGITAL CONVERSION DEVICE

(71) Applicant: DENSO CORPORATION, Kariya, Aichi-pref. (JP)

(72) Inventor: Tomohito Terazawa, Yokohama (JP)

(73) Assignee: DENSO CORPORATION, Kariya (JP)

(*) Notice: Subject to any disclaimer, the term of this patent is extended or adjusted under 35 U.S.C. 154(b) by 0 days.

(21) Appl. No.: 14/669,052

(22) Filed: Mar. 26, 2015

(65) Prior Publication Data
US 2015/0280726 A1 Oct. 1, 2015

(30) Foreign Application Priority Data
Mar. 28, 2014 (JP) .................. 2014-069764

(51) Int. Cl.
H03M 1/60 (2006.01)
H03M 1/14 (2006.01)
H03M 1/62 (2006.01)

(52) U.S. Cl.
CPC ............. *H03M 1/146* (2013.01); *H03M 1/60* (2013.01); *H03M 1/62* (2013.01)

(58) Field of Classification Search
CPC .......... H03M 1/146; H03M 1/60; H03M 1/62
USPC ........................................ 341/157, 155, 146
See application file for complete search history.

(56) References Cited

U.S. PATENT DOCUMENTS

| 5,396,247 | A  | * | 3/1995  | Watanabe et al. | ............. 341/157 |
| 6,801,150 | B2 | * | 10/2004 | Honda           | ............. 341/161 |
| 8,471,752 | B2 | * | 6/2013  | Hashimoto       | ............. 341/157 |
| 8,593,323 | B2 | * | 11/2013 | Kato            | ............. 341/155 |

FOREIGN PATENT DOCUMENTS

JP    H 05-259907    10/1993

* cited by examiner

*Primary Examiner* — Brian Young
(74) *Attorney, Agent, or Firm* — Harness, Dickey & Pierce, P.L.C.

(57) ABSTRACT

An A/D conversion device has an A/D conversion section including A/D conversion units. Each A/D conversion unit has a pulse delay circuit including delay units connected in daisy chain to form a ring delay line. Each delay unit delays a pulse signal by a delay time corresponding to an input voltage. The A/D conversion section counts the number of pulse signals that passed through the delay units during a period counted from a timing when a start signal is switched to an activation level from a non-activation level at a timing when a sampling signal is received. When each two successive timing signals CKi (i=1, 2, . . . and m) have a same specific period. The each two successive timing signals have a different phase shifted by 1/m of the specific period. Each A/D conversion unit receives the timing signal CK1 as the start signal, and the timing signal CKi+1 (CKm+1=CK1) as the sampling signal.

6 Claims, 3 Drawing Sheets

ANALOGUE TO DIGITAL CONVERSION DEVICE

CROSS-REFERENCE TO RELATED APPLICATION

This application is related to and claims priority from Japanese Patent Application No. 2014-69764 filed on Mar. 28, 2014, the contents of which are hereby incorporated by reference.

BACKGROUND OF THE INVENTION

1. Field of the Invention

The present invention relates to analogue to digital (A/D) conversion devices equipped with a plurality of delay units arranged in multiple stages, and each of the delay units is capable of delaying a received pulse signal by a delay time which corresponds to an input voltage.

2. Description of the Related Art

There have been used various types of analogue to digital (A/D) conversion devices having a conventional structure. For example, a patent document, Japanese patent laid open publication No. H05-259907 has disclosed a conventional A/D conversion device equipped with a pulse delay circuit. The pulse delay circuit is comprised of a plurality of delay units. The delay units are arranged in a ring loop shape. Each of the delay units delays a received pulse signal by a corresponding delay time determined by a magnitude of an input voltage. The conventional A/D conversion device receiveds analogue input signals and converts the received analog input signal to digital output signals. The digital output signals represent numeric data.

In the conventional A/D conversion device disclosed in Japanese patent laid open publication No. H05-259907, an activation signal having an activation level (for example, a high level) is generated in order to initiate the operation of the pulse delay circuit. After this, an output signal of each of the delay units and a counter output signal of a pulse loop counter are latched at a timing of a sampling signal. The pulse loop counter is capable of counting a number of loops of pulse signals circulated in the pulse delay circuit. In the conventional A/D conversion device, the latched signals are encoded in binary digits which represent the number of the delay units through which the pulse signals have passed. The conventional A/D conversion device outputs the encoded signals as A/D conversion data. Because the activation signal and the sampling signal are generated at a constant period, the conventional A/D conversion device outputs the A/D conversion data items at constant time intervals.

There is a conventional technique to perform the A/D conversion device previously described at a high speed. The conventional technique always maintains the activation signal having the activation level, and encodes the number of the delay units, through which the pulse signals have passed, in binary digits during one period of the sampling signal. In this conventional structure, the pulse delay circuit and the pulse loop counter must obtain A/D conversion data on the basis of a difference between two successive encoded data items because the operation of the pulse delay circuit and the operation of the pulse loop counter are not reset in every A/D conversion operation.

However, because the conventional technique previously described requires an additional subtraction unit, it becomes difficult for the subtraction unit to follow and adapt a period of receiving A/D conversion data when the operation of the A/D conversion device operates at a high speed (for example, at a GHz speed). This introduces that the A/D conversion device having the conventional structure does not perform a correct A/D conversion operation.

Further, in the conventional technique of continuously performing the operation of the pulse delay circuit and the pulse loop counter without any resetting process, because the period of the sampling signal and the period of counting the number of the delay units through which the pulse signals have passed have the same value, it is difficult to detect a high frequency component, which is higher than a frequency of the sampling frequency, to the A/D conversion data.

SUMMARY

It is therefore desired to provide an analogue to digital conversion device equipped with pulse delay circuits capable of performing an analogue to digital conversion at a high speed without using an additional subtraction unit.

An exemplary embodiment provides an analogue to digital conversion device. The analogue to digital conversion device has an analogue to digital conversion section. The analogue to digital conversion section has a plurality of analogue to digital conversion units. Each of the analogue to digital conversion units has a pulse delay circuit. The pulse delay circuit has a plurality of delay units connected in. In the analogue to digital conversion device, each of the delay units delays a pulse signal by a delay time which corresponds to an input voltage. The analogue to digital conversion section counts the number of pulse signals which have passed through the delay units during a specified period. This specified period is a time length counted from a timing when a start signal is switched to an activation state from a non-activation level to a timing when a sampling signal is received. When each of m timing signals $CK_i$ ($i=1, 2, \ldots, m$) has a same specific period and the two successive timing signals $CK_i$ have a different phase shifted by $1/m$ of the specific period to each other. Each of the analogue to digital conversion units receives the timing signal $CK1$ as the start signal, and the timing signal $CK_{i+1}$ ($CK_{m+1}=CK1$) as the sampling signal.

Because the analogue to digital conversion device having the structure previously described has no subtraction unit, it is possible to avoid the operation speed of the analogue to digital conversion device from being limited and reduced by an operation speed of the subtraction device. That is, the improved structure of the analogue to digital conversion device makes it possible to generate data items which are m times the number of data items generated by the generation speed of the analogue to digital conversion section. Further, because a period for counting the number of the delay units through which pulse signals have passed becomes $1/m$ times the period of the sampling signal, it is possible for the analogue to digital conversion data to contain more high frequency signal components.

BRIEF DESCRIPTION OF THE DRAWINGS

A preferred, non-limiting embodiment of the present invention will be described by way of example with reference to the accompanying drawings, in which.

DETAILED DESCRIPTION OF THE PREFERRED EMBODIMENTS

Figure 1:
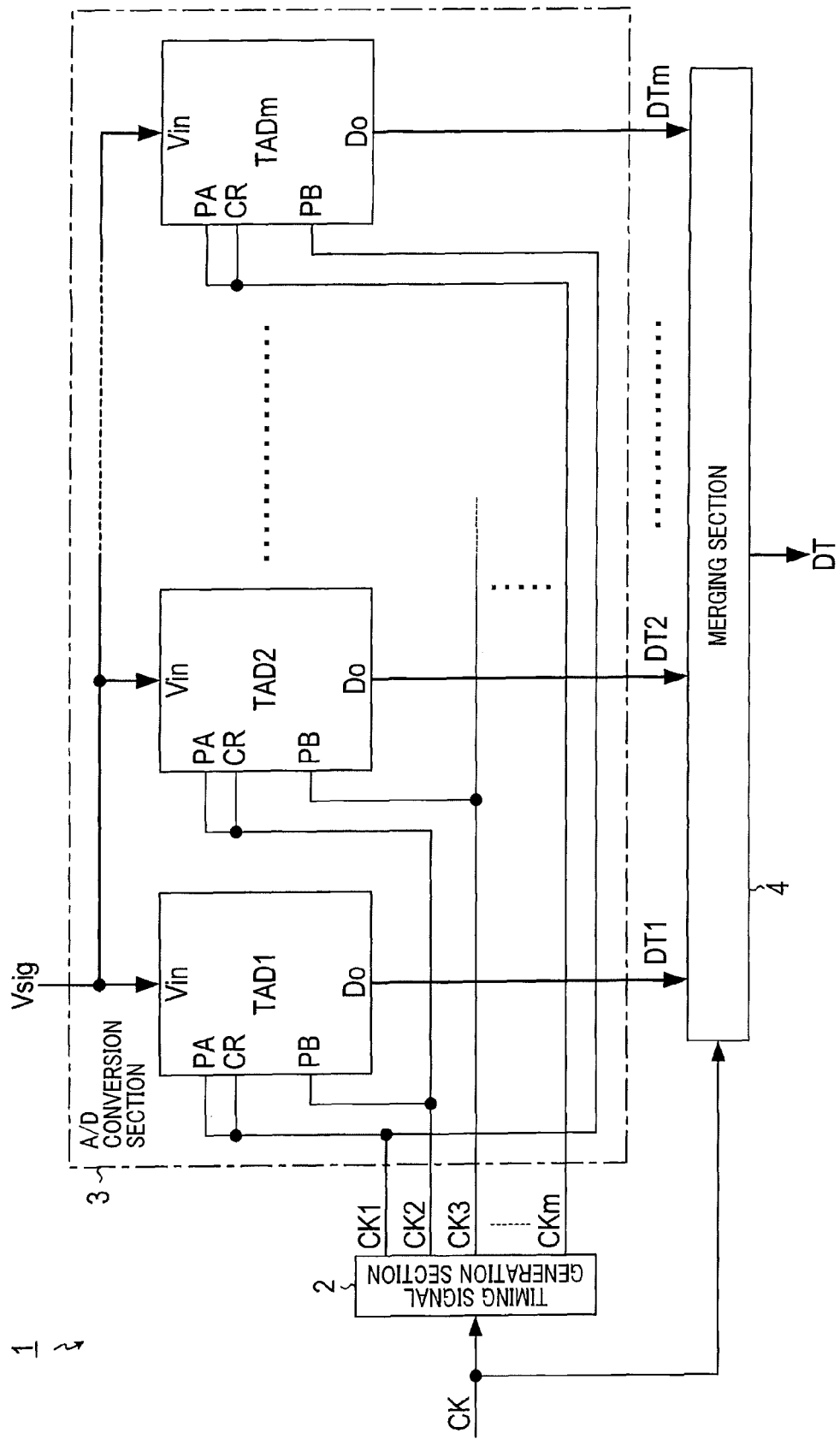
FIG. 1 is a block diagram showing an overall structure of an A/D conversion device according to an exemplary embodiment of the present invention.

Hereinafter, various embodiments of the present invention will be described with reference to the accompanying drawings. In the following description of the various embodiments, like reference characters or numerals designate like or equivalent component parts throughout the several diagrams.

Exemplary Embodiment

A description will be given of a structure and operation of an analogue to digital (A/D) conversion device 1 according to the exemplary embodiment. FIG. 1 is a block diagram showing an overall structure of the A/D conversion device 1 according to the exemplary embodiment. As shown in FIG. 1, the A/D conversion device 1 is equipped with a timing signal generation section 2 and an A/D conversion section 3, and a merging section 4.

The timing signal generation section 2 generates m timing signals CKi (i=1, 2, ... and m), i.e., timing signals CK1 to CKm (m=$2^n$) having a division period. The division period is obtained by dividing a clock signal CK by n (n is an integer of not less than two).

The timing signal generation section 2 generates a plurality of the timing signals CK1 to CKm so that each of the timing signals CK1 to CKm has a phase delayed in timing to each other by one period of the clock signal CK (i.e., a 1/m period of the timing signals CK1 to CKm).

The A/D conversion section 3 is equipped with A/D conversion units TADi (i=1, 2, ..., and m), i.e. TAD1 to TADm. Each of the A/D conversion units TAD1 to TADm converts an input voltage Vsig to digital data items DTi (i=1, 2, ..., and m). As shown in FIG. 1, the A/D conversion units TADi in the the A/D conversion section 3 output to the merging section 4 the digital data items DTi as A/D conversion output signals DT1 to DTm.

The merging section 4 operates in synchronization with the clock signal CK. When receiving the A/D conversion output signals DTi, the merging section 4 latches the A/D conversion output signals DTi transmitted from the A/D conversion section 3. The merging section 4 sequentially outputs A/D conversion data DT composed of the latched A/D conversion output signals DT1 to DTm.

[A/D Conversion Unit]

A description will now be given of a structure of each of the A/D conversion units TADi (i=1, 2, ..., m) which form the A/D conversion section 3.

As shown in FIG. 1, each of the A/D conversion units TADi is equipped with an input terminal Vin, an output terminal Do, a starting terminal PA, a sampling signal terminal PB and a reset terminal CR.

The input voltage Vsig as a target of the A/D conversion is supplied to the input terminal Vin of the A/D conversion unit TADi.

The A/D conversion output signals DTi are output through the output terminal Do of each of the A/D conversion units TADi. The timing signal CKi (i=1, 2, ..., and m) is supplied to the starting terminal PA and the reset terminal CR of the A/D conversion unit TADi (i=1, 2, ..., m), respectively.

As shown in FIG. 1, a timing signal CKi+1 is supplied to the sampling signal terminal PB. For example, the timing signal CK1 (i=1) is supplied to the starting terminal PA of the A/D conversion units TAD1, and the timing signal CK2 (CK2=$CKi_{i+1}$ when i=1) is supplied to the sampling signal terminal PB of the A/D conversion units TAD1. In particular, as shown in FIG. 1, the timing signal CK1 is supplied to the sampling terminal PB of the A/D conversion unit TADm.

Figure 2:
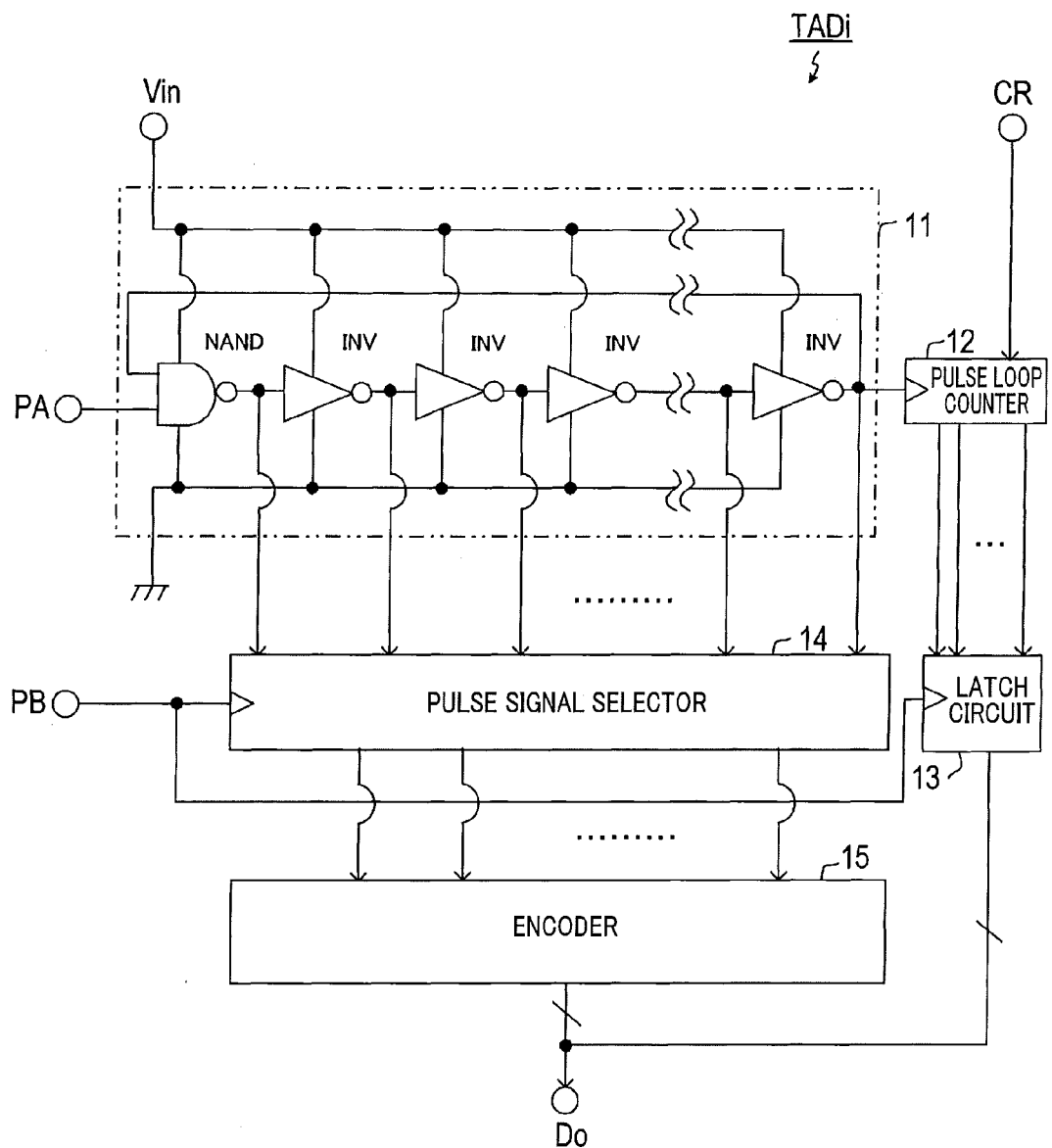
FIG. 2 is a block diagram showing a structure of each of A/D conversion units TADi ($i=1, 2, \ldots,$ and m) in the A/D conversion device according to the exemplary embodiment of the present invention shown in FIG. 1.

FIG. 2 is a block diagram showing a structure of each of the A/D conversion units TADi (i=1, 2, ..., and m) in the A/D conversion device 1 according to the exemplary embodiment shown in FIG. 1.

As shown in FIG. 2, each of the A/D conversion units TADi (i=1, 2, ..., and m) is comprised of a pulse delay circuit 11, a pulse loop counter 12, a latch circuit 13, a pulse signal selector 14 and an encoder 15 (or an encoding section). The latch circuit 13, the pulse signal selector 14 and the encoder 15 form a coding section.

The pulse delay circuit 11 is comprised of a plurality of delay units. The delay units form a ring delay line (RDL) in which the delay units are connected in daisy chain. Each of the delay units delays a pulse signal by a delay time which corresponding to an input voltage supplied to the input terminal Vin. As shown in FIG. 2, each of the delay units is comprised of a single NAND circuit and a plurality of inverters INV. The NAND circuit belongs to a first stage and the inverters INV belong to other stages. Such a NAND gate (or a negative-AND) is a logic gate which produces an output that is false only if all its inputs are true.

As shown in FIG. 2, one input terminal of the NAND gate is connected to the starting terminal PA, and the other input terminal of the NAND gate is connected to the output terminal of the inverter INV belonging to the final stage. That is, the pulse delay circuit 11 starts to output the pulse signal at the rising edge of the timing signal CKi supplied through the starting terminal PA. The pulse delay circuit 11 operates during a high level (or an activation level) of the timing signal CKi, and stops its operation when the timing signal CKi becomes a low level (or a non-activation level).

The pulse loop counter 12 counts the number of level inversions which invert a level of the output signal of the delay unit at the last stage forming the pulse delay circuit 11, and outputs the counted number as a pulse signal loop number.

In addition, the pulse loop counter 12 operates during the high level of the timing signal CKi supplied to the reset terminal CR. When the timing signal CKi supplied to the reset terminal CR is switched to a low level, the pulse loop counter 12 stops its operation, and resets its count number.

The latch circuit 13 latches the output signal (i.e. the count value) of the pulse loop counter 12 at a rising edge of the timing signal CKi+1 supplied to the sampling terminal PB.

Similar to the latch circuit 13, at a rising edge of the timing signal CKi+1 supplied to the sampling terminal PB, the pulse signal selector 14 receives the output signal transmitted from each of the delay units forming the pulse delay circuit 11, and specifies the position of the pulse loop in the pulse delay circuit 11 on the basis of a level of the received output signal of each of the delay units. The pulse signal selector 14 generates and outputs a pulse loop signal which represents the location of the pulse loop in the pulse delay circuit 11.

The encoder 15 receives the output signal, i.e. the pulse loop signal transmitted from the pulse selector 14, and generates and outputs a numeric data item which represents the stage number of the delay unit located at the position in the pulse delay circuit 11 indicated by the received pulse loop signal.

The A/D conversion units TADi (i=1, 2, ..., m) outputs data DTi through the output terminal Do. The data DTi is composed of upper bits and lower bits. The upper bits correspond to the output signal of the latch circuit 13, and the lower bits correspond to the output signal of the encoder 15.

[Operation of the A/D Conversion Device 1]

A description will now be given of the operation of the A/D conversion device 1 with reference to FIG. 3.

Figure 3:
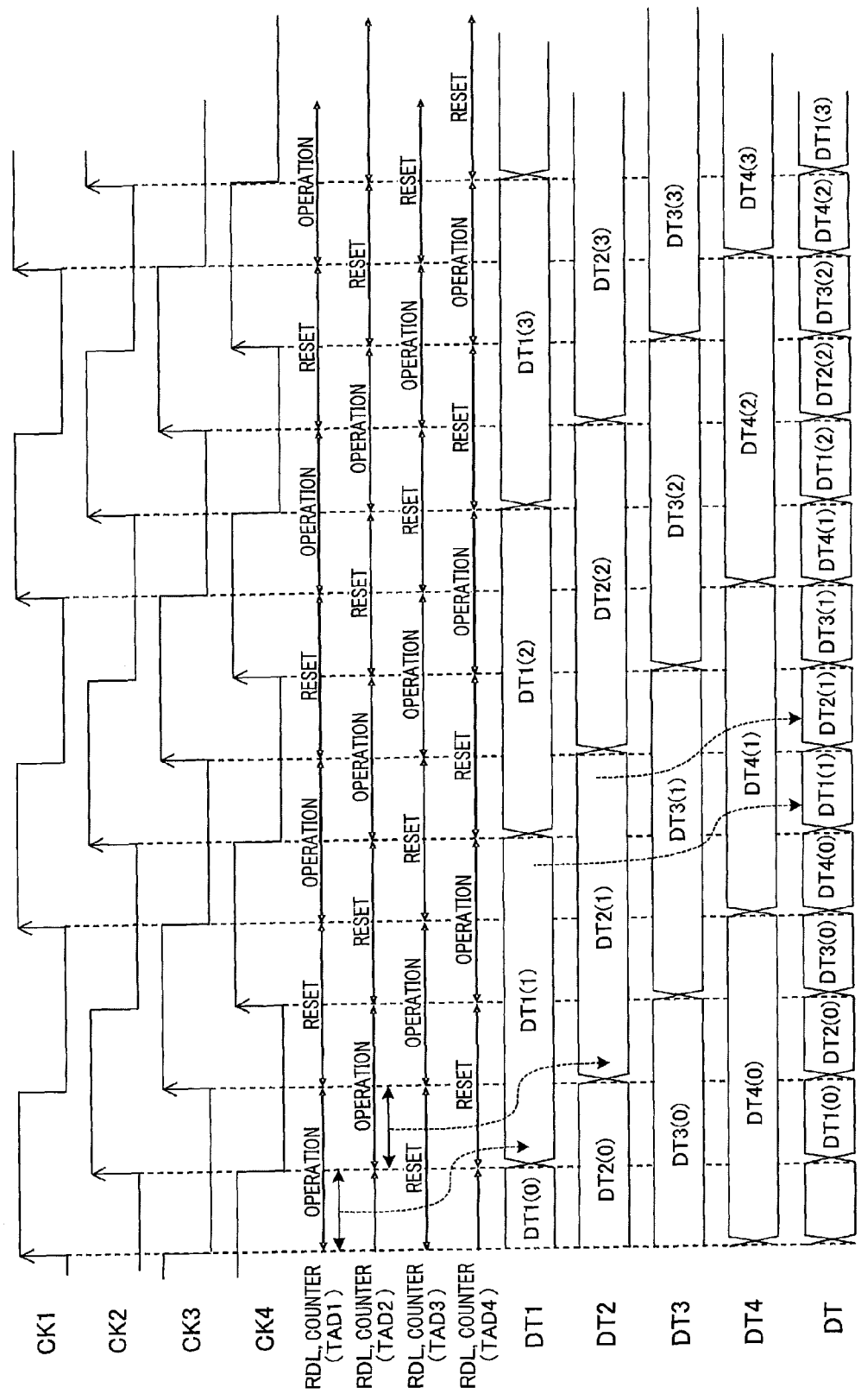
FIG. 3 is a timing chart showing an operation of the A/D conversion device according to the exemplary embodiment of the present invention shown in FIG. 1.

FIG. 3 is a timing chart showing the operation of the A/D conversion device 1 according to the exemplary embodiment shown in FIG. 1. In the following explanation, the A/D conversion device 1 has the four A/D conversion units TAD1, TAD2, TAD3 and TAD4 (m=4).

As shown in FIG. 3, the timing signal generation section 2 generates timing signals CK1 to CK4 (m=4) which are delayed by ¼ period to each other. That is, the timing signals CK1 and CK2 are delayed with respect to each other by a ¼ period. The timing signals CK2 and CK3 are delayed with respect to each other by a ¼ period. The timing signals CK3 and CK5 are delayed with respect to each other by a ¼ period.

In the A/D conversion unit TAD1, the pulse delay circuit 11 and the pulse loop counter 12 operate during a high level of the timing signal CK1. During a period from a rising edge of the timing signal CK1 to a rising edge of the timing signal CK2, the A/D conversion unit TAD1 outputs an output signal DT1 which represents the number of pulse signals which have passed through the delay units in the A/D conversion unit TAD1. The output signal DT1 is maintained in the A/D conversion unit TAD1 when the A/D conversion unit TAD1 receives a next rising edge of the timing signal CK2. When the timing signal CK1 is switched to a low level after the output signal DT1 is maintained, the pulse delay circuit 11 and the pulse loop counter 12 are reset, and wait to receive a next rising edge of the timing signal CK1. The same operation is repeated in the A/D conversion unit TAD1.

Similar to the operation of the A/D conversion unit TAD1, each of the A/D conversion units TAD2, TDA3 and TDA4 performs the same operation on the basis of the different timing signals CK2, CK3 and CK4. The timing signals CK1 and CK2 are delayed with respect to each other by a ¼ period. The timing signals CK2 and CK3 are delayed with respect to each other by a ¼ period. The timing signals CK3 and CK5 are delayed with respect to each other by a ¼ period. The output signal DTi (i=1, 2, 3 and 4) is updated at a rising edge of the timing signals CKi+1 and maintained the updated output signal.

After this, the merging section 4 latches and outputs the output signal DTi (i=1, 2, 3 and 4).

[Effects]

As previously explained in detail, according to the structure of the A/D conversion device 1 according to the exemplary embodiment shown in FIG. 1 to FIG. 3, the pulse delay circuit 11 and the pulse loop counter 12 in each of the A/D conversion unit TADi (i=1, 2, . . . , and m) are reset every A/D conversion operation without using any subtraction circuit. It is therefore possible for the A/D conversion device 1 to generate data items which are m times the number of data items generated by the encoder 15 in the A/D conversion unit TADi without limiting the operation speed of the subtraction circuit.

In the A/D conversion unit TADi, the period of counting the number of pulse signals which have passed through the delay units is a period counted from a rising edge of the timing signals CK1 to a rising edge of the timing signals CKi+1. Accordingly, because the count period of counting the number of pulse signals is 1/m period of the timing signals CKi, it is possible for the A/D conversion data DT to have a high frequency component as compared with a conventional technique previously described, in which the count period is in synchronization with the period of the timing signal CKi.

(Other Modifications)

The subject matter of the present invention is not limited by the exemplary embodiment previously described. It is possible for the A/D conversion device according to the present invention to have various modifications.

(1) In the exemplary embodiment previously described, the pulse delay circuit 11 is comprised of delay units such as the NAND circuit and the inverters INV. However, the subject matter of the present invention is not limited by this structure. It is possible for the pulse delay circuit 11 to have a plurality of inverters INV connected in daisy chain without using any NAND circuit.

(2) It is also acceptable that each of the components forming the A/D conversion device 1 according to the exemplary embodiment is comprised of a plurality of components. It is also possible to replace each of the components forming the A/D conversion device 1 with a known device having the same function.

While specific embodiments of the present invention have been described in detail, it will be appreciated by those skilled in the art that various modifications and alternatives to those details could be to developed in light of the overall teachings of the disclosure. Accordingly, the particular arrangements disclosed are meant to be illustrative only and not limited to the scope of the present invention which is to be given the full breadth of the following claims and all equivalents thereof.

What is claimed is:

1. An analogue to digital conversion device comprising:
an analogue to digital conversion section comprising a plurality of analogue to digital conversion units (TADi, i=1, 2, . . . m), each of the analogue to digital conversion units (TADi) comprising a pulse delay circuit, each of the pulse delay circuits comprising a plurality of delay units (NAND, INV) connected in a daisy chain,
wherein each of the delay units delays a pulse signal by a delay time which corresponds to an input voltage (Vin), and the analogue to digital conversion section counts the number of pulse signals which have passed through the delay units during a period counted from a timing when a start signal is switched to an activation state from a non-activation level to a timing when a sampling signal is received,
where each of m timing signals CKi (i=1, 2, . . . , m) has a same specific period and two successive timing signals CKi have a different phase shifted by 1/m of the specific period to each other, and
each of the analogue to digital conversion units (TADi) receives the timing signal CK1 as the start signal, and the timing signal CKi+1 (CKm+1=CK1) as the sampling signal.

2. The analogue to digital conversion device according to claim 1, wherein the analogue to digital conversion section comprises:
the pulse delay circuit comprising the delay units capable of circulating the pulse signal in a pulse loop during the activation level of the start signal, where the pulse loop is formed by the delay units which are connected in the daisy chain to form a ring delay line;
a pulse loop counter capable of counting the number of the pulse signals looped in the ring delay line formed by the delay units during the activation level of the start signal, and the pulse loop circuit being reset during an non-activation level of the start signal; and
an encoding section capable of generating an analogue to digital conversion value on the basis of a position of the pulse signal in the delay units and the count value of the pulse loop counter obtained at a timing of the sampling signals.

3. The analogue to digital conversion device according to claim 1, further comprising a merging section capable of sequentially selecting the analogue to digital conversion units (TADi) and latching the output signal of the selected analogue to digital conversion units (TADi) one time during one period of the timing signals CK1 to CKm, and outputting the latched output signals.

4. The analogue to digital conversion device according to claim 2, further comprising a merging section capable of sequentially selecting the analogue to digital conversion units (TADi) and latching the output signal of the selected analogue to digital conversion units (TADi) one time during one period of the timing signals CK1 to CKm, and outputting the latched output signals.

5. The analogue to digital conversion device according to claim 1, wherein a NAND circuit is arranged at a first stage and a plurality of inverters (INV) are arranged in each of second to final stages, respectively to form the delay units in the pulse delay circuit.

6. The analogue to digital conversion device according to claim 2, wherein a NAND circuit is arranged at a first stage and a plurality of inverters (INV) are arranged at a second stage to a final stage, respectively to form the delay units in the pulse delay circuit.

* * * * *